United States Patent
Ikeda et al.

(10) Patent No.: US 6,181,119 B1
(45) Date of Patent: Jan. 30, 2001

(54) CIRCUIT COMPENSATING FOR CHANGE IN INTERNAL POWER SUPPLY VOLTAGE, AND SEMICONDUCTOR INTEGRATED CIRCUIT DEVICE INCLUDING SUCH A CIRCUIT

(75) Inventors: Yutaka Ikeda; Takashi Itou, both of Hyogo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/227,937

(22) Filed: Jan. 11, 1999

(30) Foreign Application Priority Data

Jul. 29, 1998 (JP) .................................................. 10-214113

(51) Int. Cl.[7] ................................ G05F 1/40; H03K 3/01
(52) U.S. Cl. ............................................ 323/282; 327/537
(58) Field of Search .................................... 323/282, 280, 323/312, 315, 266; 327/534, 537

(56) References Cited

U.S. PATENT DOCUMENTS 5,557,193 * 9/1996 Kajimoto ............................. 323/282
5,694,076 * 12/1997 Ishibashi ............................. 327/541
5,744,998 * 4/1998 Ito et al. ............................. 327/537

FOREIGN PATENT DOCUMENTS 10-027027    1/1998   (JP) .

* cited by examiner

Primary Examiner—Peter S. Wong
Assistant Examiner—Rhjnikant D. Patel
(74) Attorney, Agent, or Firm—McDermott, Will & Emery

(57) ABSTRACT

A semiconductor integrated circuit device includes an internal voltage-down converter and a voltage compensation circuit. The internal voltage-down converter provides an internal power supply voltage. The voltage compensation circuit includes a comparator, a capacitor, a transistor, and a constant current source. When the voltage (internal power supply voltage) of the output node suddenly drops, the potential at the positive input of the comparator is reduced by the coupling effect of the capacitor. As a result, the output node is charged. The potential of the positive input of the comparator is charged. As a result, the charging with respect to the output node ends.

12 Claims, 4 Drawing Sheets

CIRCUIT COMPENSATING FOR CHANGE IN INTERNAL POWER SUPPLY VOLTAGE, AND SEMICONDUCTOR INTEGRATED CIRCUIT DEVICE INCLUDING SUCH A CIRCUIT

BACKGROUND OF THE INVENTION

1. Field of the Invention

The present invention relates to a voltage compensation circuit and a semiconductor integrated circuit device. More particularly, the present invention relates to a voltage compensation circuit that can compensate for an abrupt change in an internal power supply voltage, and a semiconductor integrated circuit device including such a circuit.

2. Description of the Background Art

A conventional internal voltage-down converter included in a semiconductor integrated circuit device will be described with reference to FIG. 5.

A conventional internal voltage-down converter 900 of FIG. 5 includes a comparator 27 and a PMOS transistor 29. Comparator 27 has a positive input receiving an internal power supply voltage Vout from an output node Z0 of internal voltage-down converter 900, and a negative input receiving a reference voltage Vin. Comparator 27 compares reference voltage Vin with internal power supply voltage Vout.

PMOS transistor 29 connected between power supply voltage Vdd and output node Z0 has a gate electrode connected to comparator 27. PMOS transistor 29 is turned on/off in response to the output (comparison result) of comparator 27. Output node Z0 is charged when PMOS transistor 29 is turned on. Accordingly, the level of voltage Vout of output node Z0 is adjusted.

In the conventional internal voltage-down converter 900 of the above structure, the ripple rejection is improved as the difference between the power supply voltage and the output voltage becomes greater.

The need arises for a semiconductor integrated circuit device to operate using a further lower voltage in order to satisfy the demands of higher integration density. The operating environment of a conventional voltage-down converter is getting more severe.

There was a problem that the level of internal power supply voltage Vout cannot be recovered to the level of the intended reference voltage Vin with respect to an abrupt change in internal power supply voltage Vout.

SUMMARY OF THE INVENTION

In view of the foregoing, an object of the present invention is to provide a voltage compensation circuit that can compensate for an abrupt change in the internal power supply voltage.

Another object of the present invention is to provide a semiconductor integrated circuit device that can operate at high speed by compensating for an abrupt change in the internal power supply voltage.

According to an aspect of the present invention, a voltage compensation circuit of the present invention compensates for a change in the internal power supply voltage. The voltage compensation circuit includes a detection circuit detecting a differential component of the internal power supply voltage, a comparator circuit comparing the differential component of the internal power supply voltage with a reference voltage, and a compensation circuit compensating for a change in the internal power supply voltage in response to the comparison result.

An advantage of the present invention lies in that change in the internal power supply voltage can be compensated for in response to only the differential component of the internal power supply voltage. Therefore, the level of the internal power supply voltage can be recovered speedily and properly to a desired level.

According to another aspect of the present invention, a semiconductor integrated circuit device includes a voltage-down converter generating an internal power supply voltage which is a down-converted version of a power supply potential, and a voltage compensation circuit compensating for a change in the internal power supply voltage in response to the result of comparison between a differential component of the internal power supply voltage and a reference voltage.

Another advantage of the present invention lies in that a voltage compensation circuit is provided that compensates for change in the internal power supply voltage in response to only the differential component of the internal power supply voltage with respect to an internal voltage-down converter generating an internal power supply voltage which is a down-converted version of a power supply voltage, so that the level of the internal power supply voltage can be recovered speedily and properly to a desired level. Accordingly, internal circuitry can operate properly and speedily, impervious to change in the internal power supply voltage.

Particularly, the voltage compensation circuit can alter the input of a comparator in response to only the differential component of an internal power supply voltage. As a result, an internal power supply voltage can be charged/discharged speedily and properly.

Particularly, the voltage compensation circuit includes a capacitor to charge the internal power supply voltage in response to only the differential component of the internal power supply voltage. As a result, the internal power supply voltage can be increased speedily and properly.

Particularly, a transistor or a diode can be used as a charging circuit.

Particularly, the voltage compensation circuit includes a capacitor to discharge the internal power supply voltage in response to only the differential component of the internal power supply voltage. Thus, the internal power supply voltage can be reduced speedily and properly.

Particularly, a transistor or a diode can be used as a discharging circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

FIRST EMBODIMENT

Figure 1:
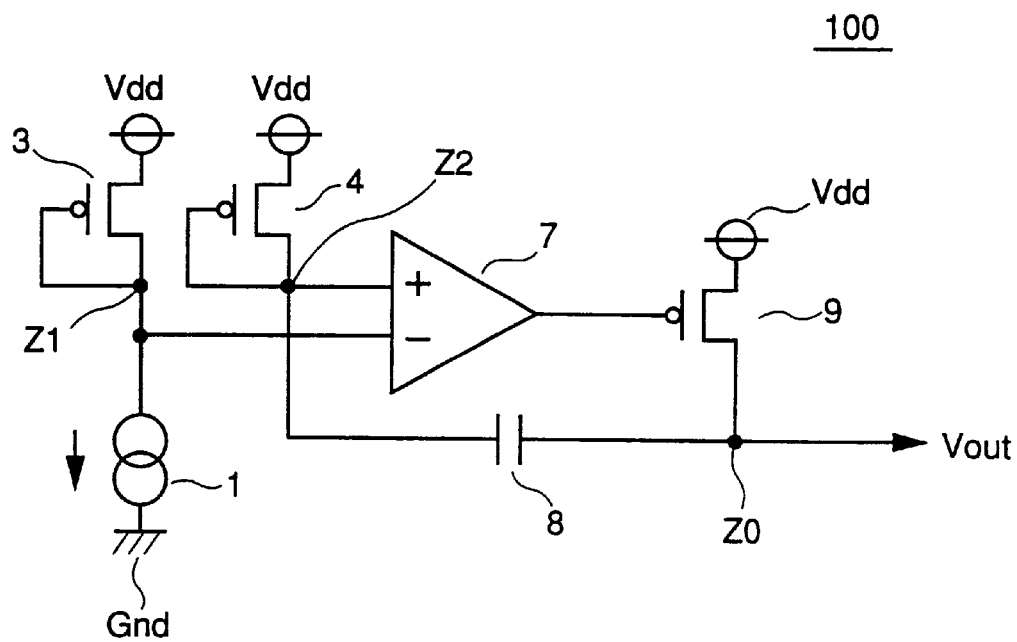
FIG. 1 shows an example of a structure of a voltage compensation circuit according to a first embodiment of the present invention.

A voltage compensation circuit and a semiconductor integrated circuit device according to a first embodiment of the present invention will be described hereinafter. The first embodiment of the present invention relates to a voltage compensation circuit that can compensate for an abrupt change in the internal power supply voltage, and a semiconductor integrated circuit device including such a circuit.

A voltage compensation circuit forming the semiconductor integrated circuit device of the first embodiment will be described with reference to FIG. 1. A voltage compensation circuit 100 of FIG. 1 compensates for an abrupt voltage drop of an internal power supply voltage Vout at an output node Z0.

Voltage compensation circuit 100 includes a constant current source 1, PMOS transistors 3, 4 and 9, a comparator 7 and a capacitor 8.

PMOS transistor 3 is connected between a power supply voltage Vdd and a node Z1 (negative input of comparator 7). PMOS transistor 3 has its gate electrode connected to node Z1. Constant current source 1 is connected between node Z1 and ground potential Gnd. Constant current source 1 and PMOS transistor 3 generates a constant voltage with respect to power supply voltage Vdd.

PMOS transistor 4 is connected between power supply voltage Vdd and a node Z2 (positive input of comparator 7). The gate electrode of PMOS transistor 4 is connected to node Z2. Capacitor 8 is connected between node Z2 and output node Z0. Capacitor 8 and PMOS transistor 4 form a voltage division circuit. PMOS transistor 4 is turned on/off in response to the potential at node Z2.

PMOS transistor 9 is connected between power supply voltage Vdd and output node Z0. PMOS transistor 9 receives the output of comparator 7 at its gate electrode. Comparator 7 compares the voltage of node Z1 with the voltage of node Z2. PMOS transistor 9 is turned on/off in response to the comparison result of comparator 7.

The semiconductor integrated circuit device including the structure shown in FIG. 1 will be described with reference to FIG. 2.

Figure 2:
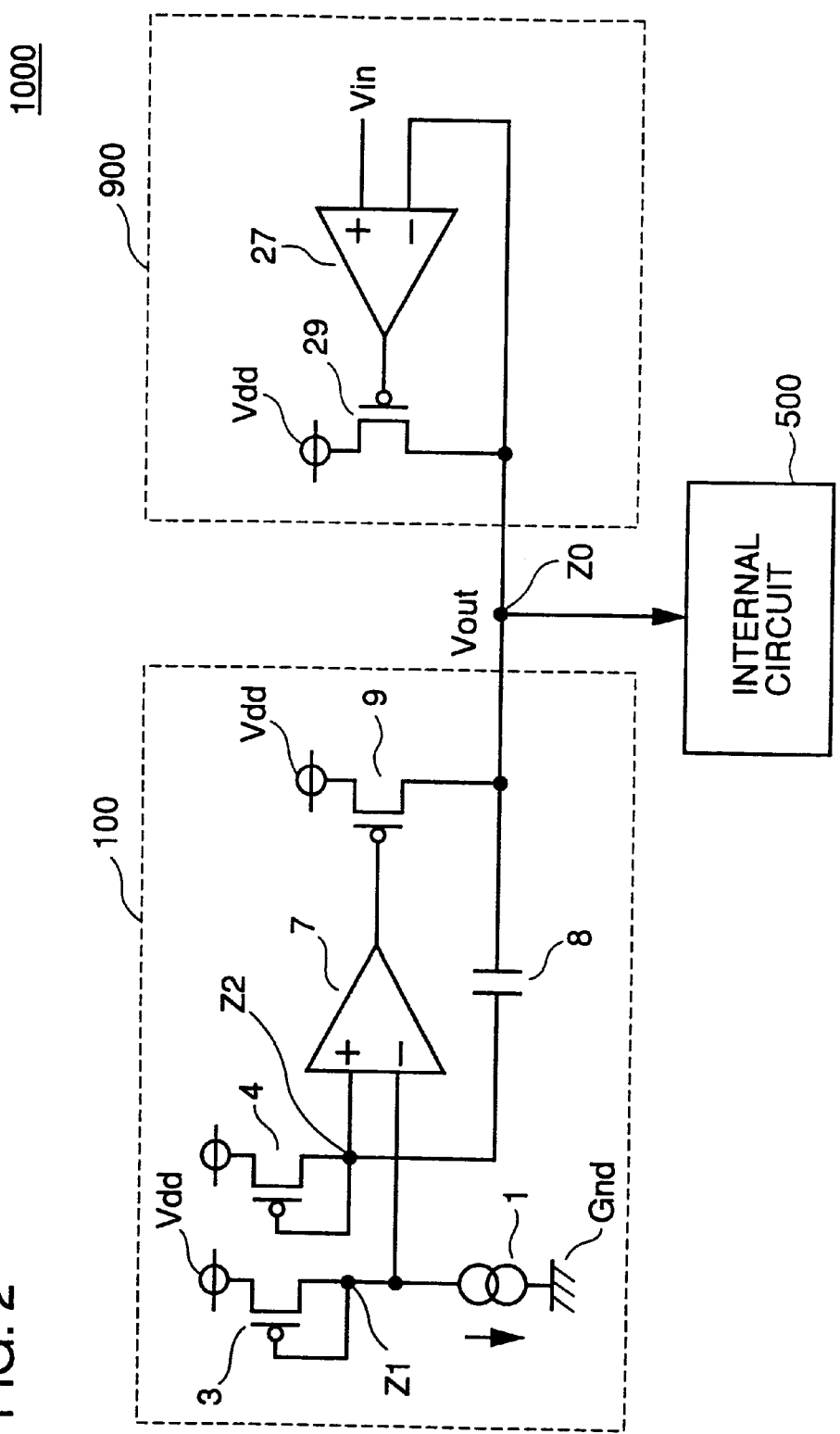
FIG. 2 shows main components of a semiconductor integrated circuit device 1000 including a voltage compensation circuit 100 of FIG. 1.

A semiconductor integrated circuit device 1000 of FIG. 2 includes an internal voltage-down converter 900, a voltage compensation circuit 100, and an internal circuit 500. Voltage compensation circuit 100 and internal voltage-down converter 900 are connected at node Z0. Internal voltage-down converter 900 supplies an internal power supply voltage Vout to node Z0. Voltage compensation circuit 100 operates to compensate for an abrupt change (drop) of internal power supply voltage Vout. Internal circuit 500 receives the voltage of node Z0 to operate.

The operation of voltage compensation circuit 100 of FIG. 1 will be described hereinafter. In a steady state, the potential at the positive input (node Z2) of comparator 7 is set to be higher than the potential of the negative input (node Z1) of comparator 7.

Now, the level of internal power supply voltage Vout exhibits a sudden drop. In this case, the potential of node Z2, i.e., the potential at the positive input of comparator 7, is reduced by the coupling of capacitor 8. As a result, comparator 7 provides an output of an L (logical low) level.

PMOS transistor 9 receives the signal of an L level from comparator 7 to be turned on. Accordingly, output node Z0 is charged.

The potential of the positive input of comparator 7 gradually rises since charging is effected via PMOS transistor 4. Therefore, the potential at the positive input of comparator 7 is recovered so that the output of comparator 7 attains an H level (logical high). At this stage, the charging of output node Z0 ends.

Thus, voltage compensation circuit 100 charges node Z0 in response to only the differential component of internal power supply voltage Vout when internal power supply voltage Vout suddenly drops. Thus, the level of internal power supply Vout can be recovered speedily and properly to the aimed voltage level.

Thus, internal circuit 500 in semiconductor integrated circuit device 1000 is immune to the effect caused by change in internal power supply voltage Vout to allow correct and speedy operation. The PMOS transistor of FIG. 1 can be replaced with an NMOS transistor. Alternatively, a diode can be used.

Another structure of a voltage compensation circuit according to the first embodiment of the present invention will be described with reference to FIG. 3. A voltage compensation circuit 200 of FIG. 3 compensates for a sudden increase in the level of internal power supply voltage Vout at output node Z0.

Voltage compensation circuit 200 includes a constant current source 2, NMOS transistors 5, 6 and 10, a comparator 7 and a capacitor 8.

Constant current source 2 is connected between power supply voltage Vdd and a node Z11 (negative input of comparator 7). NMOS transistor 5 is connected between node Z11 and ground potential Gnd. The gate electrode of NMOS transistor 5 is connected to node Z11. Constant current source 2 and NMOS transistor 5 generate a constant voltage with respect to power supply voltage Vdd.

NMOS transistor 6 is connected between ground potential Gnd and a node Z12 (positive input of comparator 7). NMOS transistor 6 has its gate electrode connected to node Z12. Capacitor 8 is connected between node Z12 and output node Z0. Capacitor 8 and NMOS transistor 6 form a voltage division circuit. NMOS transistor 6 is turned on/off in response to the potential of node Z12.

NMOS transistor 10 is connected between ground potential Gnd and output node Z0. The gate electrode of NMOS transistor 10 receives the output of comparator 7. Comparator 7 compares the voltage of node Z11 with the voltage of node Z12. NMOS transistor 10 is turned on/off in response to the comparison result of comparator 7.

A semiconductor integrated circuit device including the structure of FIG. 3 will be described with reference to FIG. 4.

Figure 4:
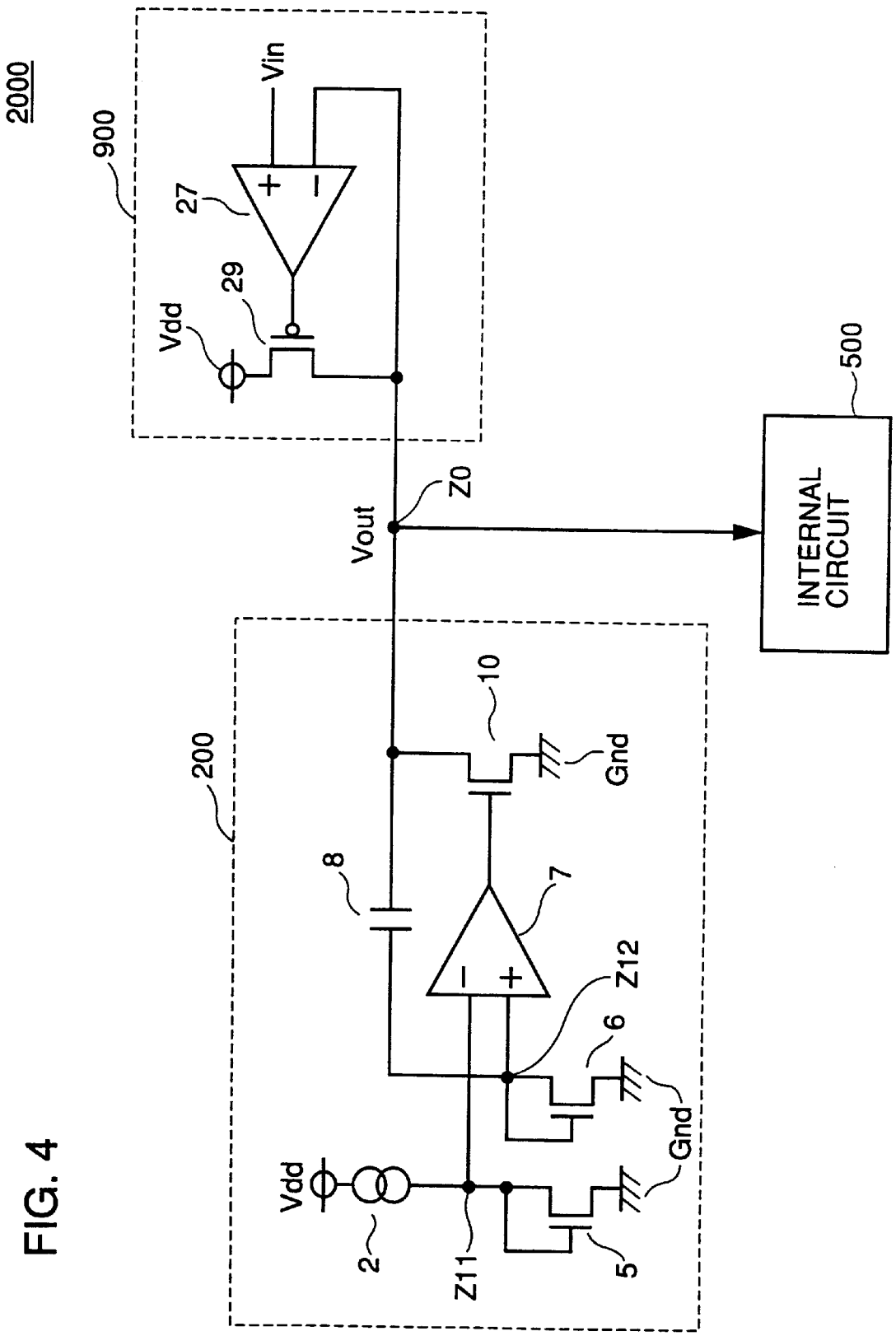
FIG. 4 shows main components of a semiconductor integrated circuit device 2000 including a voltage compensation circuit 200 of FIG. 3.
Figure 5:
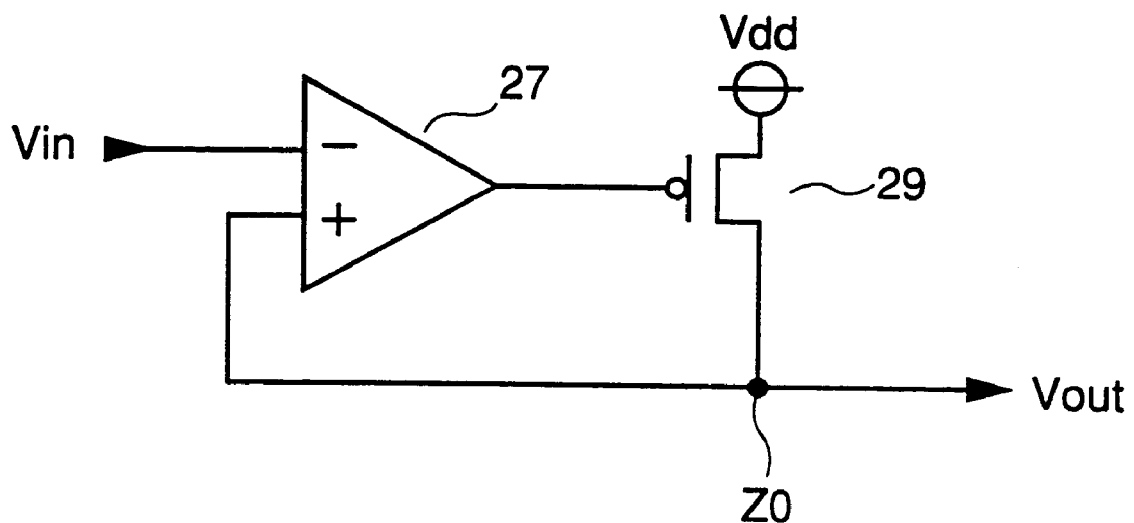
FIG. 5 shows a structure of a conventional internal voltage-down converter 900 according to a semiconductor integrated circuit device.

A semiconductor integrated circuit device 2000 of FIG. 4 includes an internal voltage-down circuit 900, a voltage compensation circuit 200, and an internal circuit 500. Voltage compensation circuit 200 and internal voltage-down circuit 900 are connected by node Z0. Internal voltage-down converter 900 supplies an internal power supply voltage Vout. Voltage compensation circuit 200 operates to compensate for a sudden change (rise) of internal power supply voltage Vout. Internal circuit 500 operates in response to the voltage of node Z0.

The operation of voltage compensation circuit 200 of FIG. 3 will be described now. At a steady state, the potential of the negative input (node Z11) of comparator 7 is set to be higher than the potential of the positive input (node Z12) of comparator 7.

Now, internal power supply voltage Vout exhibits a sudden increase. In this case, the potential of node Z12, i.e., the potential of the positive input of comparator 7, increases by the coupling of capacitor 8. As a result, comparator 7 provides an output of an H level.

NMOS transistor 10 receives the signal of an H level from comparator 7 to be turned on. As a result, output node Z0 is discharged.

The potential of the positive input of comparator 7 is gradually reduced due to the discharge via NMOS transistor 6. Accordingly, the potential of the positive input of comparator 7 is recovered so that the output of comparator 7 attains an L level. Here, the discharge at output 20 ends.

Thus, voltage compensation circuit 200 discharges node Z0 in response to only the differential component of internal power supply voltage Vout when internal power supply voltage Vout suddenly increases. Thus, internal power supply voltage Vout can be recovered speedily and properly to the aimed voltage level.

As a result, internal circuit 500 in semiconductor integrated circuit device 2000 is impervious to variation in internal power supply voltage Vout. A proper and speedy operation is allowed. The NMOS transistor of FIG. 3 is replaceable with a PMOS transistor. Alternatively, a diode can be used.

Figure 3:
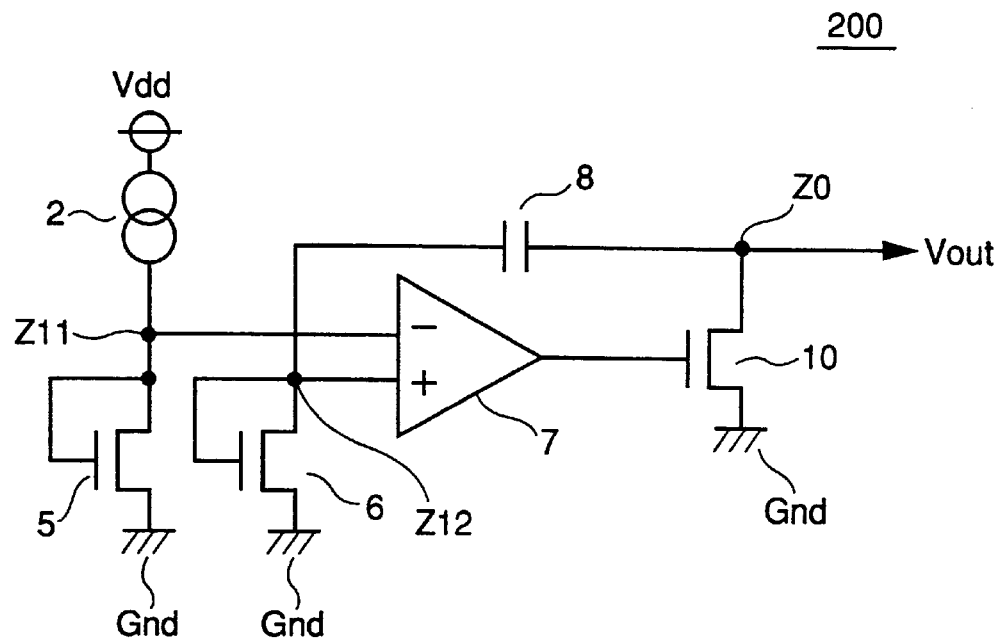
FIG. 3 shows another structure of a voltage compensation circuit according to the first embodiment of the present invention.

In both the voltage compensation circuit 100 of FIG. 1 and voltage compensation circuit 200 of FIG. 3, constant current sources 1 and 2 are connected only at the negative input side of comparator 7. However, in the voltage compensation circuits of FIGS. 1 and 3, a constant current source can be connected to both the positive input end and negative input end of comparator 7. For example, in the structure of FIG. 1, an additional constant current source can be provided between node Z2 and ground potential Gnd. In the structure shown in FIG. 3, an additional constant current source can be provided between node Z12 and power supply voltage Vdd.

In this case, the employed constant current source does not have to be strictly a constant current supply source. Any source that does not generate difference between the constant current sources connected to the positive/negative input ends can be employed.

In the above embodiment, power consumption can be reduced by disabling the constant current source when the voltage compensation circuit is inactive.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage compensation circuit compensating for a change in an internal power supply voltage comprises:
   - detection means for detecting only a differential component of said internal power supply voltage;
   - comparator means for comparing the differential component of said internal power supply voltage with a reference voltage; and
   - compensation means for compensating for a change in said internal power supply voltage in response to only said comparison result.

2. The voltage compensation circuit according to claim 1, wherein said comparator means comprises a comparator including a first input node and a second input node to compare a voltage of said first input node with a voltage of said second input node,
   said second input node receiving said reference voltage,
   wherein said compensation means comprises
   a power supply node receiving said internal power supply voltage, and
   first charging/discharging means for charging/discharging said power supply node in response to an output of said comparator,
   wherein said detection means comprises
   a capacitor connected between said power supply node and said first input node, and
   second charging/discharging means for charging/discharging said first input node in response to a voltage of said first input node.

3. A semiconductor integrated circuit device comprising:
   voltage-down converter means for generating an internal power supply voltage which is a down-converted version of a power supply voltage; and
   voltage compensation means for detecting only a differential component of said internal power supply voltage for compensating for a change in said internal power supply voltage in response to only a comparison between the differential component of said internal power supply voltage and a reference voltage.

4. The semiconductor integrated circuit device according to claim 3, wherein said voltage compensation means comprises
   detection means for detecting only the differential component of said internal power supply voltage,
   comparator means for comparing the differential component of said internal power supply voltage with the reference voltage, and
   compensation means for compensating for a change in said internal power supply voltage in response to only said comparison result.

5. The semiconductor integrated circuit device according to claim 4, wherein said comparator means comprises a comparator including a first input node and a second input node to compare a voltage of said first input node with a voltage of said second input node,
   said second input node receiving said reference voltage,
   wherein said compensation means comprises
   a power supply node receiving said internal power supply voltage, and
   first charging/discharging means for charging/discharging said power supply node in response to an output of said comparator,
   wherein said detection means comprises
   a capacitor connected between said power supply node and said first input node, and
   second charging/discharging means for charging/discharging said first input node in response to a voltage of said first input node.

6. The semiconductor integrated circuit device according to claim 3, wherein said voltage compensation means comprises
   a comparator including a positive input node and a negative input node to compare a voltage of said positive input node with a voltage of said negative input node, and a power supply node receiving said internal power supply voltage, first charging means for charging said power supply node in response to an output of said comparator, a capacitor connected between said power supply node and said positive input node, and second charging means for charging said positive input node in response to a voltage of said positive input node, said negative input node receiving said reference voltage.

7. The semiconductor integrated circuit device according to claim 6, wherein said second charging means comprises a transistor arranged between a power supply voltage and said positive input node, and having a gate electrode connected to said positive input node.

8. The semiconductor integrated circuit device according to claim 6, wherein said second charging means comprises a diode arranged between a power supply voltage and said positive input node.

9. The semiconductor integrated circuit device according to claim 3, wherein said voltage compensation means comprises a comparator including a positive input node and a negative input node to compare a voltage of said positive input node and a voltage of said negative input node, a power supply node receiving said internal power supply voltage, first discharge means for discharging said power supply node in response to an output of said comparator, a capacitor connected between said power supply node and said positive input node, and second discharging means for discharging said positive input node in response to a voltage of said positive input node, said negative input node receiving said reference voltage.

10. The semiconductor integrated circuit device according to claim 9, wherein said second discharging means comprises a transistor arranged between a ground potential and said positive input node, and having a gate electrode connected to said positive input node.

11. The semiconductor integrated circuit device according to claim 9, wherein said second discharging means comprises a diode arranged between a ground potential and said positive input node.

12. A voltage compensation circuit compensating for a change in an internal power supply voltage comprising:

detection means for detecting a differential component of said internal power supply voltage;

comparator means for comparing said detected differential component of said internal power supply voltage with a reference voltage; and compensation means for compensating for a change in said internal power supply voltage in response to said comparison result, said compensation means being stopped in operation when said differential component is not detected.

* * * * *